United States Patent [19]
Fong

[11] Patent Number: 5,814,174
[45] Date of Patent: Sep. 29, 1998

[54] METHOD FOR REPAIR OF METALLIZATION ON CIRCUIT BOARD SUBSTRATES

[75] Inventor: Stewart O. Fong, Torrance, Calif.

[73] Assignee: Hughes Electronics Corporation, Los Angeles, Calif.

[21] Appl. No.: 664,657

[22] Filed: Jun. 17, 1996

[51] Int. Cl.$^6$ .............................. B29C 73/04; B32B 35/00
[52] U.S. Cl. ........................ 156/94; 29/402.01; 156/309.3
[58] Field of Search ............................ 156/94, 98, 309.3; 427/96, 140; 29/829, 846, 402.01; 428/63

[56] References Cited

U.S. PATENT DOCUMENTS

| | | | |
|---|---|---|---|
| 3,775,579 | 11/1973 | Burghart | 29/402.01 |
| 4,935,584 | 6/1990 | Boggs | 29/830 |
| 4,997,517 | 3/1991 | Parthasarathi | 29/827 |
| 5,019,944 | 5/1991 | Ishii | 361/783 |
| 5,153,986 | 10/1992 | Brauer | 29/846 |
| 5,255,431 | 10/1993 | Burdick | 156/299 |
| 5,457,149 | 10/1995 | Hall | 525/523 |
| 5,491,612 | 2/1996 | Nicewarner | 361/760 |

OTHER PUBLICATIONS

"Ablefilm® 501–Low Temperature Cure, Eletronics Grade Adhesive Film", Ablestik Laboratories, Rev. Aug. 1982.

*Primary Examiner*—Daniel Stemmer
*Attorney, Agent, or Firm*—Elizabeth E. Leitereg; Terje Gudmestad; Michael W. Sales

[57] ABSTRACT

A method of repairing an area of metallization that has lifted from a circuit board substrate uses a dry film epoxy placed between the lifted metallization and the substrate. Downward pressure and heat are simultaneously applied to the lifted area to rebond it to the substrate. Both metallization pads and traces may be repaired with the method, and the resulting bond may be stronger than that originally present. When heated, the dry film epoxy will melt and cure very quickly, requiring no further processing. The method is particularly useful when repairing circuit boards intended for microwave circuitry, in which conductive ribbons are gap welded to metallization pads. A metallization pad repair operation may be combined with a ribbon attachment operation, accomplishing both with one gap welding operation. The gap welder provides the downward force and heat necessary to bond the ribbon and repair the lifted pad.

16 Claims, 5 Drawing Sheets

| EPOXY FILM TYPE | PULL STRENGTH (DYNES) |
|---|---|
| ABLEFILM 506 | 133624 |
| ABLEFILM 550 | 148986 |
| ABLEFILM 550M | 250277 |
| ABLEFILM 562-018 | 333768 |
| ABLEFILM 564 AK | 110216 |
| ABLEFILM 568 | 194292 |
| FM 24 | 170688 |

FIG. 10

METHOD FOR REPAIR OF METALLIZATION ON CIRCUIT BOARD SUBSTRATES

BACKGROUND OF THE INVENTION

1. Field of the Invention

This invention relates to methods of repair of circuit board metallization, particularly when an area of the metallization has lifted from the circuit board substrate.

2. Description of the Related Art

A circuit board often comprises an insulating substrate cladded with a conductive layer of metal, such as copper. Some of the metal layer is then selectively removed from the substrate, with a chemical etching process, for example, leaving what is known as the circuit board's "metallization." The metallization typically provides "pads," i.e. square metal areas on the substrate surface to which an electrical conductor can be attached, and "traces," i.e. thin paths of metal on the substrate surface used to carry electrical signals and voltages from one point to another, interconnecting two or more pads, for example.

One type of electrical conductor that can be attached to a metallization pad is a conductive "ribbon." Ribbons are often used to carry electrical signals on microwave circuit boards, usually connecting a passive component such as a resistor or capacitor to a metallization pad. The operation of attaching the ribbon to the pad may be accomplished with a "gap welder." A gap welder is a device having a tip consisting of two small adjacent metal prongs. The two prongs are brought into contact with the ribbon, and a voltage potential is applied across them. The ribbon creates a short circuit between the two prongs. This causes the area between the prongs to be suddenly heated, often accompanied by some arcing. This heat can either cause the ribbon to partially melt in the area between the prongs, welding it to the pad, or with the application of solder between the ribbon and the pad, cause the ribbon to be soldered to the pad.

One common type of board has copper metallization, to which ribbons made of silver are gap welded. In this case, solder is typically used to bond the ribbon to the pad. Other boards use gold ribbons, which are attached to gold-plated metallization pads. Here, solder is generally not needed, as the gap welding operation fuses the ribbon to the pad.

Metallization pads can also be connected to integrated circuits dies, usually using "wire bonds," i.e. short lengths of uninsulated wire. A wire bond is attached to a pad using a wire bonding tool rather than a gap welder.

A problem arises with these types of circuit boards in which a metallization pad or a portion of a trace can lift or become raised from the substrate. This is typically caused by heat used to perform some operation on the board, such as gap welding, wire bonding, soldering or desoldering. The metallization is typically attached to the substrate with an adhesive. A localized area of adhesive may fail when subjected to the kind of thermal shock presented by these operations, resulting in an area of metallization that pops off the substrate. When a pad or trace has lifted, there is an increased risk that the lifted metallization will become severed or cause signal degradation. Furthermore, lifted metallization increases the risk of a short circuit occurring on the board. Also, loss of contact with the substrate can deprive the lifted metallization of substrate properties that may be necessary or advantageous to the circuit for which the board is used. For example, the high frequency performance of a microwave circuit board can be adversely affected by such a loss of contact. The performance obtained from a circuit board damaged in this way is likely to be unacceptable.

One repair method uses a liquid epoxy to reattach the lifted metallization to the substrate. Liquid epoxy is applied either to the underside (substrate side) of the lifted metallization, to the substrate itself below the lifted area, or to both. The metallization is then pressed back onto the substrate, to which it must be held until the liquid epoxy has cured. Curing a liquid epoxy typically requires an extended period of time and exposure to an elevated temperature.

The use of liquid epoxy has many disadvantages. The need to cure the epoxy can require costly temperature control equipment, as well as time to cure. As a liquid, the epoxy may not remain localized at the damaged area, but may run into other areas of the board where it is unwanted. An excessive amount of liquid epoxy may adversely affect the dielectric constant of the board. Finally, once repaired using liquid epoxy, the repaired area may be susceptible to a recurrence of lifting if the area is again subjected to heat.

Due to the lack of acceptable repair methods, circuit boards having areas of lifted metallization have typically been discarded, often after having been fully populated with components. Having to discard boards damaged in this way, many containing a high number of expensive, complex components and requiring a considerable amount of labor to fabricate, is a serious and costly problem for the electronics industry. This problem has heretofore gone unsolved, despite the strong demand for a method to salvage such boards. A need exists for a simple, quick, reliable method to repair metallization that has lifted from a circuit board substrate, so that the time and money invested in such boards is not wasted.

SUMMARY OF THE INVENTION

A novel method for repairing areas of metallization that have lifted from a circuit board substrate is presented, thus making it possible to salvage circuit boards so damaged. A dry film adhesive is placed between the lifted metallization and the substrate. Downward pressure and heat are simultaneously applied to the lifted area to quickly melt and cure the adhesive, thus rebonding the lifted area of metallization to the substrate.

Both metallization pads and traces may be repaired with the method, which may produce a stronger metallization to substrate bond than was originally present. The adhesive used to make a repair is preferably a dry film epoxy. A piece of dry film epoxy of an appropriate size may be placed either on the underside of the lifted metallization, or on the substrate surface. Due to the quick curing time of the preferred dry film epoxy, extended curing times requiring elevated temperatures are avoided—heat need be applied for less than 1 second to complete a repair.

The downward force and heat needed to make a repair per the method are preferably supplied by a gap welder, which provides both simultaneously, though other devices that can provide sufficient heat and force will suffice.

This novel linking of a simultaneous application of heat and force (as is provided by a gap welder), with the unique properties of a dry film epoxy, provides a repair method that is particularly well-suited for use on circuit board substrates.

The method is particularly useful when repairing circuit boards intended for microwave circuitry. These circuits often use conductive ribbons to interconnect a metallization pad and a passive component. A distinct advantage of the method is its ability to combine a metallization repair operation with another operation, such that both are accomplished simultaneously. For example, a ribbon may be attached to a lifted metallization pad and a lifted pad simultaneously reattached to a substrate with the same gap welding operation. By the time the ribbon attachment operation is complete, the metallization repair will be done as well.

The method can also be used to attach other structures, such as heat sinks or component sockets, to a substrate, as long as the structures are capable of withstanding the heat and force required by the method without becoming damaged.

The use of this repair method gives the electronics industry, particularly those engaged in the fabrication of microwave circuit boards, a way to remedy a problem that usually occurs either well into the fabrication process, when the board is being populated, or after it is fully populated. The method largely eliminates the current practice of disposing of boards with this problem, thus saving many boards that would otherwise be scrapped. The repair method thus solves a long-endured and serious problem in this industry.

Further features and advantages of the invention will be apparent to those skilled in the art from the following detailed description, taken together with the accompanying drawings.

DESCRIPTION OF THE DRAWINGS

FIG. 10 is a table showing test results obtained with the method using different types of adhesive.

DETAILED DESCRIPTION OF THE INVENTION

A novel, efficient, reliable method of repairing areas of metallization that have lifted from a circuit board substrate is presented.

The usual cause for an area of metallization to become lifted from a substrate is thermal shock, in which the application of heat to perform some operation on a circuit board causes the adhesive holding the metallization to the substrate to fail in the area being heated.

Figure 1:
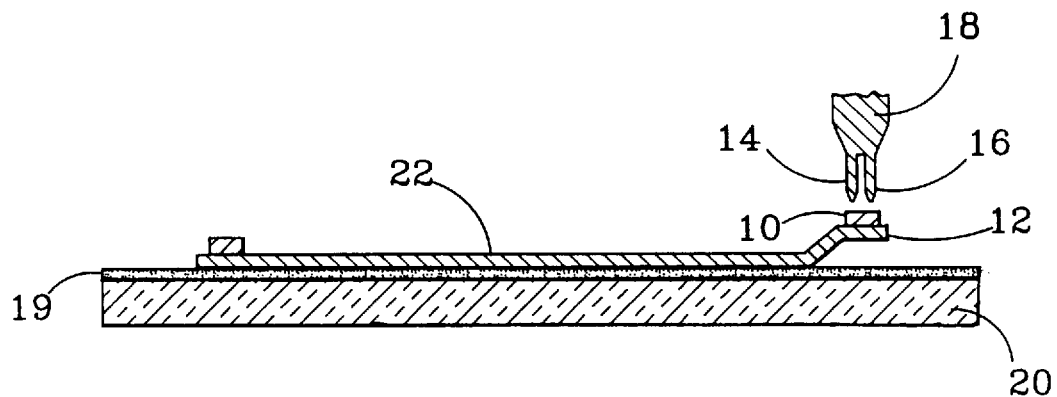
FIG. 1 is an elevation view of a condition that may be repaired with the present method.
Figure 2:
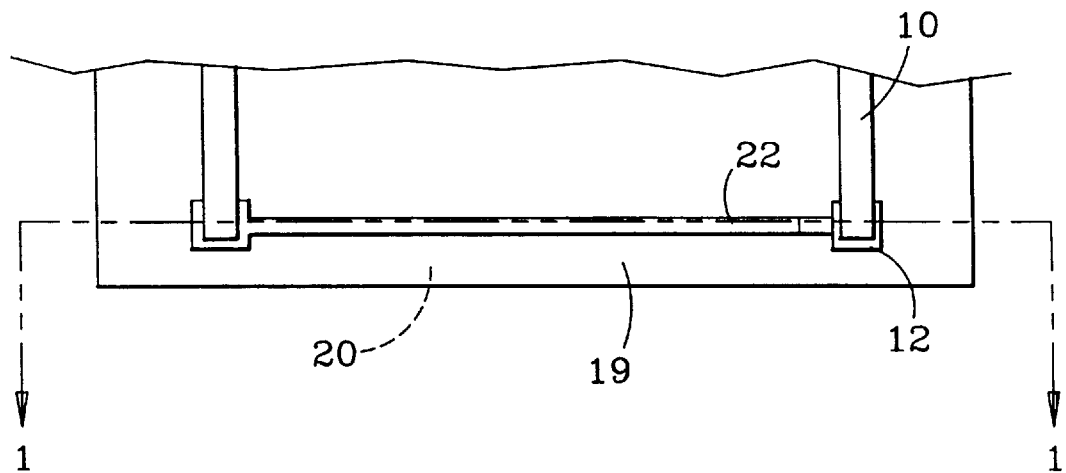
FIG. 2 is a plan view of the condition shown in FIG. 1.

Three common operations in which an area of metallization can become lifted are depicted in FIGS. 1, 2, 3 and 4. In FIGS. 1 and 2, an interconnecting ribbon 10 is gap welded to a metallization pad 12 by applying a voltage across a pair of prongs 14, 16 that form a welder's tip 18. There are several parameters involved when gap welding is performed: the voltage across the prongs 14, 16, the length of time the voltage is applied, i.e. the "weld dwell time," and the force with which the tip 18 is brought into contact with the ribbon 10. A voltage that is too high, a weld dwell time that is too long, or a force that is too high can adversely affect the adhesive 19 beneath the metallization pad 12 and cause the pad to lift from the substrate 20, leaving it suspended above the substrate by its connecting trace 22. Even a perfectly performed gap weld may cause a pad to lift, due to the thermal shock delivered to the adhesive beneath the metallization that is inherent in a gap welding operation.

Figure 3:
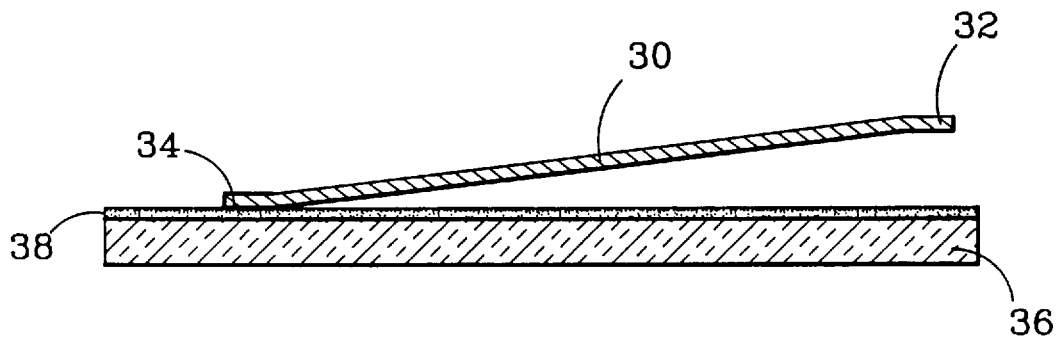
FIGS. 3 and 4 are elevation views of other conditions that may be repaired with the present method.

In FIG. 3, a portion of a metallization trace 30 and a pad 32 to which it is connected are lifted. A trace usually interconnects two metallization pads 32, 34. When performing an operation on a pad 32 involving heat, a trace 30 may lift from the substrate 36 due to the heat carried to the lifted area by conduction, causing the adhesive 38 beneath it to fail. If a trace 30 is lifted, the pad 32 to which it is connected will usually be lifted as well. It is possible, however, to have a portion of a trace lifted by itself. This can happen if, for example, the lifted trace is over a particularly weak section of adhesive.

Figure 4:
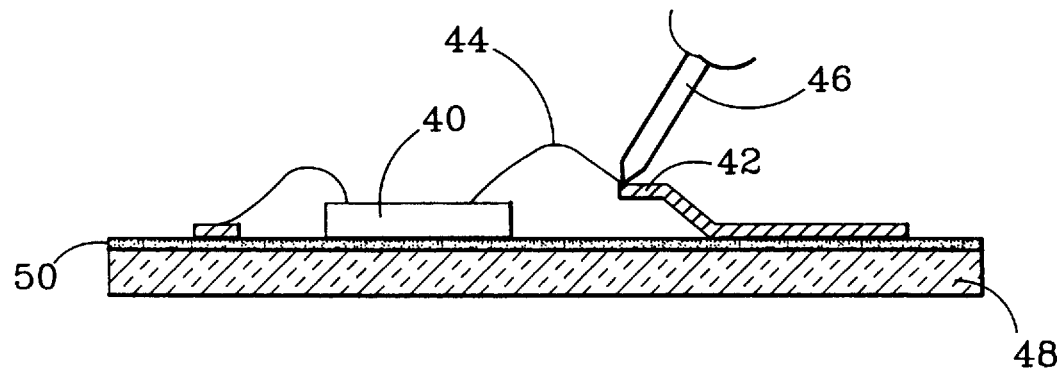

In FIG. 4 a component 40, such as a monolithic microwave integrated circuit die, is attached to a circuit board metallization pad 42 with a wire bond 44, using a wire bonding tool 46. A wire bonding tool uses ultrasonic energy to create heat and thus to bond the piece of wire 44 to the pad 42. As heat is applied to perform the wire bonding operation, the pad 42 to which the wire bond 44 is being attached may pop up from the substrate 48, as the adhesive 50 beneath it fails due to the heat. This can also occur when a packaged component having its own input and output leads, such as a DIP or flat-pack I.C., has a component lead or pin soldered to a pad.

A pad or portion of a trace may lift even if there is no heat involved. Many other causes, such as a defective adhesive layer beneath the metallization, can cause the problem to occur.

Figure 5:
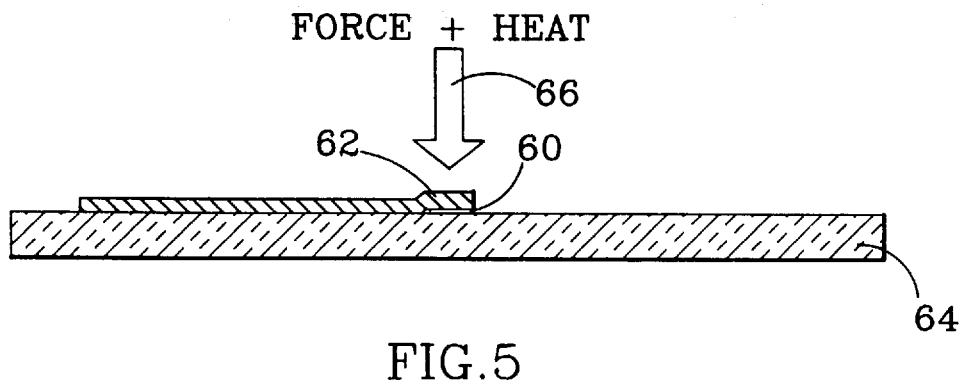
FIG. 5 is an elevation view illustrating the new repair method.
Figure 6:
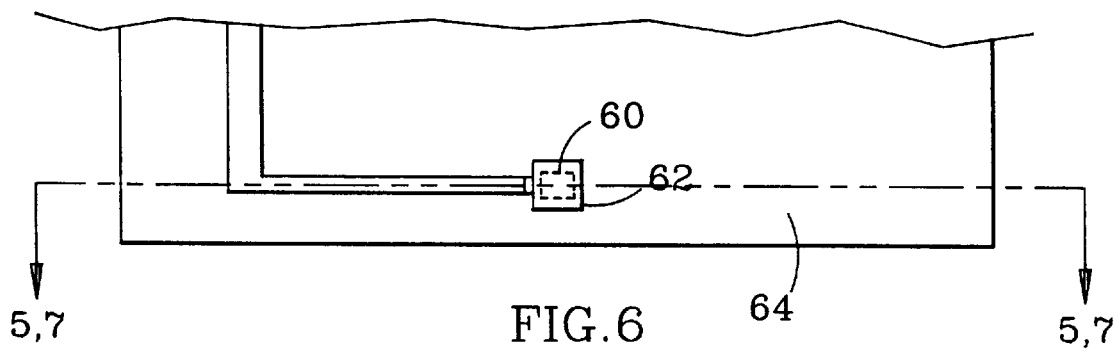
FIG. 6 is a plan view of the structure being repaired in FIG. 5.
Figure 7:
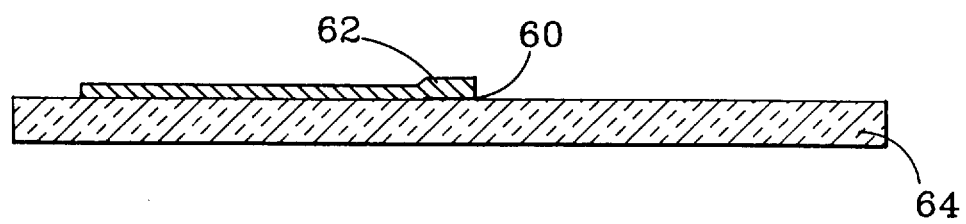
FIG. 7 is an elevation view showing the results of using the new method.

The method of repair for damage due to each of the above or similar causes is essentially the same, and is shown in FIGS. 5 and 6:

1) A piece of dry film adhesive 60 of an appropriate size (defined below), preferably a dry film epoxy, is obtained.
2) The piece of epoxy 60 is placed between the lifted area of metallization 62 and the substrate 64.
3) Downward force and heat 66 are applied to the lifted area 62 until the epoxy 60 melts and cures.
4) The downward force and heat 66 are removed. The lifted area 62 has been reattached to the substrate 64 and the repair is complete, as shown in FIG. 7.

The use of a dry film epoxy for this purpose offers many advantages. The dry film epoxy has a very brief curing time. As it is a dry film, it will not run into areas of a board where it is not wanted, as a liquid epoxy might. The amount of dry film epoxy used can be carefully controlled by the repair person, so that its effect on a board's dielectric constant are predictable and minimal. Furthermore, the use of a dry film epoxy to repair a lifted area of metallization may produce a bond between substrate and metallization that is equal to or stronger than it was originally.

Figure 8:
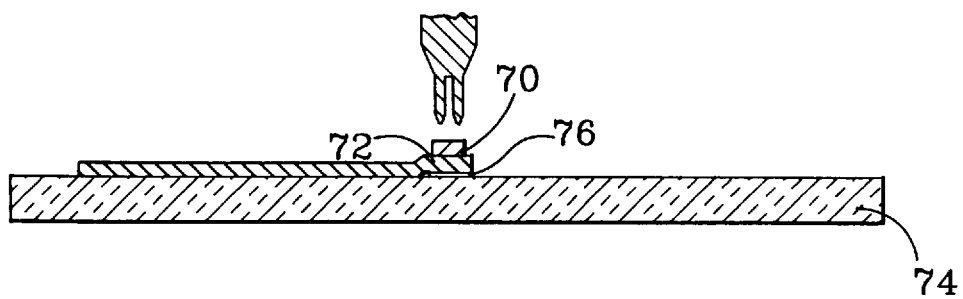
FIGS. 8 and 9 are elevation views illustrating other applications for the repair method.

Another significant advantage of the repair method is that it may be performed simultaneously with another operation. In the example of FIG. 8, a ribbon 70 needs to be attached to a metallization pad 72 that has lifted from a substrate 74. An appropriately sized piece of dry film epoxy 76 is placed between the pad 72 and the substrate 74. The ribbon 70 is placed into position on top of the pad 72 and gap welded to it. The gap welding operation that is required to attach the ribbon 70 to the pad 72 also provides the downward force and heat necessary to melt and cure the epoxy 76, reattaching the lifted metallization pad 72 to the substrate 74.

A gap welder is preferred to perform a repair per the present method since it can be preset to a particular force, voltage and weld dwell time, offering a well-controlled application of heat and force. Other devices, such as a soldering iron, could be used as well, though such devices may not offer the same degree of control over the repair process as a gap welder.

A wire bonding tool generally will not provide enough heat to melt and cure the epoxy. If a pad to which a wire bond will be made has lifted, the pad repair should be performed first, using a gap welder, followed by the wire bonding operation.

The gap welder settings used to perform a metallization repair are the same as those used to attach a ribbon to a pad. The force, weld dwell time and voltage that suffice for a ribbon attachment operation are also acceptable for a pad repair.

A preferred gap welder is the MCM550, using a VTA-96 head, both manufactured by Hughes Aircraft Company. This device has a welding tip with a width of about 0.38 mm (15 mils). A ribbon, typically about 0.63 mm (25 mils) wide, is attached to a metallization pad using the following typical gap welder parameters: a downward force of about 227 grams (0.5 lbs.), a voltage across the prongs of about 0.60 volts, and a weld dwell time of about 60 milliseconds.

Solder may also be involved in a gap welding operation. If a gold ribbon is to be attached to a gold-plated metallization pad, the gap welding operation will bond them together without the use of solder. If the ribbon is silver and the pad is copper, a solder bump is placed on the pad and the ribbon placed atop the solder bump. In this case, the gap welding operation melts the solder, thus joining the ribbon to the pad. The solder preferred in this instance is SN62, which is composed of 62% lead and 38% tin, and is commonly available.

It is not required that a ribbon attachment be done to make a repair. A pad or a trace can also be repaired independently of any other operation. The gap welder need simply be set up as if it were going to be used to perform a ribbon attachment. However, in this situation the welding tip will contact the lifted pad or trace directly, rather than the ribbon.

When heat is applied from a gap welder to the dry film epoxy with this method, the epoxy will first melt, and then very shortly thereafter will become cured and hardened. Therefore, there is no need to maintain a downward force on the metallization after removing the heat. Due to the rapid curing time of the preferred epoxy, the downward force and the heat may be removed simultaneously. The epoxy will have hardened by the time the gap welding operation is completed.

The preferred dry film epoxy used to perform repairs is Ablefilm, from Ablestik Labs in Rancho Dominguez, Calif. Ablefilm part numbers 506, 550, 550M, 562-018, 564-AK, and 568, and dry film adhesive FM 24 from American Cyanamid Co. in Havre de Grace, Md., have each been satisfactorily used to perform a metallization repair per the present method. This product is available in sheet form, from which a repair person would custom-cut a piece of epoxy to suit an individual repair task, or can be pre-cut by the manufacturer per a customer's specifications. The thickness of the piece of dry film epoxy used is preferably in the range of 0.075–0.225 mm.

An "appropriately sized" piece of dry film epoxy is, in the case of a lifted pad, a piece having approximately the same area as the lifted metallization. Thus, if a 5 mm by 5 mm metallization pad has become lifted, a piece of dry film epoxy having about the same area should be placed between the pad and the substrate. As the piece of epoxy melts it will tend to spread out, so using a piece slightly smaller than the pad is sufficient. Using a piece that is larger than the pad will also work, but will cover more board area than is necessary to perform the repair.

Figure 9:
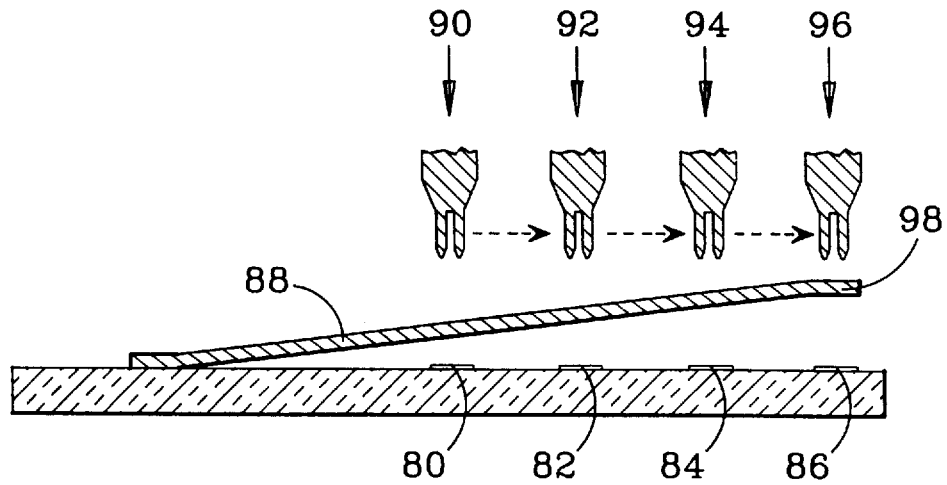

If a lifted portion of a trace is being repaired, a piece of epoxy can be prepared that is about equal to the size of the lifted portion. Alternatively, several smaller pieces can be spaced at intervals along the lifted area. For example, if the lifted portion of a trace is 2 mm by 15 mm, a piece of epoxy having an area of about 2 mm by 15 mm can be placed beneath the lifted portion, or as shown in FIG. 9, four pieces 80, 82, 84, 86 that are each 2 mm by 2 mm can be placed at equal intervals beneath the lifted portion of the trace 88. In either case, the repair is preferably made by bringing a gap welder tip 90 into contact with the lifted portion 88, and operating the welder as if to perform a ribbon attachment operation. Gap welding operations 90, 92, 94, 96 should be performed over each piece of epoxy used, in sequence, to assure that each piece is fully melted and cured.

Typically, when a trace 88 is lifted, the metallization pad 98 to which it is connected will also be lifted. In this case, pieces of epoxy need to be positioned to repair both pad and trace, as described above.

The piece of dry film epoxy may be positioned either on the underside (substrate side) of the lifted area of metallization, or on the substrate itself, below the lifted area. This type of epoxy tends to be tacky, so that a piece that has been pressed with a modest amount of vertical force to the underside of a lifted area of metallization is likely to stay in place until the repair is completed. A similar amount of force should be used to press a piece onto the substrate itself, so that is will remain stationary until the repair is completed.

After the piece of dry film epoxy is in place, downward force and heat are applied until the epoxy melts and cures. Using a gap welder as described above, a piece of epoxy can melt and cure in 60 milliseconds or less. The amount of downward force needed to make a repair by this method is not critical. It is only necessary that enough force be provided to bring the various elements in contact with each other. For example, if a ribbon is being attached to a pad, and the pad is being reattached to a substrate with a piece of dry film epoxy, it is sufficient if enough force is applied to simultaneously bring the ribbon in contact with the pad, the pad in contact with the epoxy, and the epoxy in contact with the substrate. The heat used to melt the epoxy must be applied while the force is being applied. Once the epoxy has melted and cured, the heat and force may be removed.

A primary application of the repair method is with a microwave circuit board. This type of board has a substrate with properties that are well-suited to microwave circuits, such as a low thermal coefficient of dielectric constant or a high thermal conductivity, is populated with monolithic microwave integrated circuit dies that are connected to metallization pads with wire bonds, and typically uses conductive ribbons to carry electrical signals from one pad to another or from a pad to a passive component such as a resistor or capacitor. The ribbons are gap welded to the pads. A well-known copper-cladded substrate used for microwave circuit boards is "TMM-10" from Rogers Corp. in Chandler, Ariz. This type of substrate, after having its copper cladding chemically etched to produce a metallization pattern, has responded well to the metallization repair method.

The new repair method should provide satisfactory results in many applications in which an area of metallization has lifted from a substrate, as long as the imposition of a dry film epoxy onto the board has no adverse affect on the board or the circuit it carries. In addition to its primary use as a metallization repair method, the method may also be used to affix other kinds of structures to a circuit board substrate. For example, a heat sink or a component socket can be firmly bonded to the substrate using dry film epoxy. An appropriately sized piece or pieces of epoxy is placed on the substrate, and the structure placed atop the epoxy. Downward force and heat are applied to the structure. The structure being bonded must be capable of withstanding the force and heat required by the method without damage. Thus, the method would be well-suited to bond a heat sink to a substrate, for example, since the force and heat required to create the bond can probably be tolerated. However, the method is likely to be unsuitable to bond the body of a component such as a resistor or capacitor to a substrate, since this would require that heat and force be applied directly to the body of the component, possibly damaging it. For a larger structure such as a heat sink, a gap welder may not be capable of providing the force and heat to melt the epoxy and bond the structure, necessitating the use of another type of device.

Test results performed on metallization that has been repaired as described herein reveal a very strong bond between the metallization and substrate, that in some cases is stronger than the bond that originally existed. A "pull strength" test is performed in which two lifted pads having an interconnecting ribbon between them are reattached using the method. A hook connected to a force gauge is hooked on the ribbon, which is then pulled with the hook while monitoring the force gauge until the pad or pads lift from the substrate or when the ribbon itself breaks. The force at which this occurs is the "pull strength." A table giving approximate pull strengths for the types of Ablestik and American Cyanamid dry film epoxies listed above is shown in FIG. 10. Similar testing was performed on metallization traces repaired per the method described herein, resulting in pull strengths of between about 341,376 to 458,420 dynes. Typical pull strength requirements in the industry call for minimum pull strengths of between 146,304 and 195,072 dynes.

While particular embodiments of the invention have been shown and described, numerous variations and alternate embodiments will occur to those skilled in the art. Accordingly, it is intended that the invention be limited only in terms of the appended claims.

I claim:

1. A method for repair of metallization that has lifted from a circuit board substrate, comprising the steps of:

obtaining one or more pieces of dry film adhesive, said adhesive sized to cover an area approximately equal to the area of the lifted metallization, placing said dry film adhesive between said substrate and said lifted area of metallization, applying force to said lifted area of metallization to keep the lifted area in contact with said dry film adhesive and said dry film adhesive in contact with said substrate, heating said dry film adhesive while applying said force until said adhesive melts and cures, thereby reattaching said lifted area of metallization to said substrate, bonding an electrical conductor to said lifted area of metallization, wherein said force is applied to said conductor and thereby to said lifted area of metallization, and whereby said heating simultaneously bonds said conductor to said metallization and melts and cures said adhesive to reattach said metallization to said substrate, and removing said force and said heat.

2. The method of claim 1, wherein said dry film adhesive is applied to the substrate directly below said lifted area of metallization.

3. The method of claim 1, wherein said dry film adhesive is applied to the underside of the lifted area of metallization.

4. The method of claim 1, wherein said conductor is silver.

5. The method of claim 1, wherein said conductor is gold.

6. The method of claim 1, wherein said electrical conductor is a conductive ribbon.

7. The method of claim 1, further comprising the step of placing solder between said electrical conductor and said lifted area of metallization, whereby said heating simultaneously solders said conductor to said metallization and melts and cures said adhesive to reattach said metallization to said substrate.

8. The method of claim 7, wherein said solder comprises 62% lead and 38% tin.

9. The method of claim 1, wherein said heating and said force are provided by a gap welder.

10. The method of claim 1, wherein said circuit board comprises a copper-cladded microwave substrate.

11. The method of claim 1, wherein said metallization is copper.

12. The method of claim 1, wherein said metallization is gold-plated.

13. The method of claim 1, wherein said dry film adhesive is a dry film epoxy.

14. The method of claim 1, wherein said lifted area of metallization is a pad for connecting to said electrical conductor.

15. The method of claim 1, wherein said lifted area of metallization is a trace providing an electrical connection between two or more places on the circuit board.

16. The method of claim 1, wherein said one or more pieces of adhesive are each about 0.15 mm thick.

* * * * *